(12) United States Patent
Grillo

(10) Patent No.: US 11,749,885 B2
(45) Date of Patent: *Sep. 5, 2023

(54) IMAGE-CAPTURING DOORBELL DEVICE

(71) Applicant: Google LLC, Mountain View, CA (US)

(72) Inventor: Jacobi Colton Grillo, San Jose, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/055,549

(22) Filed: Nov. 15, 2022

(65) Prior Publication Data
US 2023/0071275 A1 Mar. 9, 2023

Related U.S. Application Data

(63) Continuation of application No. 17/663,177, filed on May 12, 2022, now Pat. No. 11,522,284, which is a
(Continued)

(51) Int. Cl.
*H01Q 1/52* (2006.01)
*H04N 7/18* (2006.01)
(Continued)

(52) U.S. Cl.
CPC .............. *H01Q 1/52* (2013.01); *H01Q 1/22* (2013.01); *H01Q 21/061* (2013.01);
(Continued)

(58) Field of Classification Search
CPC ...... G07C 9/00309; G07C 2009/00769; G07C 9/00111; G07C 9/00071; H04W 12/08;
(Continued)

(56) References Cited

U.S. PATENT DOCUMENTS

| 5,403,782 A | 4/1995 | Dixon et al. |
| 8,081,468 B2 | 12/2011 | Hill et al. |

(Continued)

FOREIGN PATENT DOCUMENTS

| CN | 205566533 | 9/2016 |
| CN | 107995393 | 5/2018 |

(Continued)

OTHER PUBLICATIONS

"Foreign Office Action", TW Application No. 110136748, dated Feb. 2, 2023, 11 pages.
(Continued)

*Primary Examiner* — Jared Walker
(74) *Attorney, Agent, or Firm* — Colby Nipper PLLC

(57) ABSTRACT

This document describes an image-capturing doorbell device. In aspects, the image-capturing doorbell device provides a compact, space-efficient, battery-powered, doorbell camera. The architecture of the image-capturing doorbell device is optimized by concentrating sensors at one end of the device and user input mechanism(s) at the opposing end of the device and including a thin and narrow middle portion between the two opposing ends. The sensors include an image sensor and a PIR sensor mounted to the same PCB for space conservation. A camera lens protrudes from an outer surface of an IR window aligned with IR LEDs to mitigate IR flare. The PIR sensor is aligned with a lens that enhances radial motion detection by implementing two stacked rows of lenslets. The user input mechanism includes a light ring formed via a two-shot molding technique with a button to bond the light ring to the button for enhanced waterproofing.

20 Claims, 11 Drawing Sheets

Related U.S. Application Data continuation of application No. PCT/US2021/044204, filed on Aug. 2, 2021, which is a continuation of application No. 17/122,449, filed on Dec. 15, 2020, now Pat. No. 11,336,005, and a continuation of application No. 17/061,872, filed on Oct. 2, 2020, now Pat. No. 11,277,941.

(51) Int. Cl.
| | | |
|---|---|---|
| H05K 7/14 | (2006.01) | |
| H01Q 1/22 | (2006.01) | |
| H01Q 21/06 | (2006.01) | |
| G08B 3/10 | (2006.01) | |
| H04R 1/02 | (2006.01) | |

(52) U.S. Cl.
CPC ........... *H04N 7/186* (2013.01); *H05K 7/1427* (2013.01); *G08B 3/10* (2013.01); *H04R 1/028* (2013.01)

(58) Field of Classification Search
CPC .... G06K 9/00228; G08B 13/00; E05B 39/00; H04N 7/186
See application file for complete search history.

(56) References Cited

U.S. PATENT DOCUMENTS

| | | | |
|---|---|---|---|
| 9,113,051 | B1 | 8/2015 | Scalisi |
| 9,848,517 | B2 | 12/2017 | Koeppel et al. |
| 10,042,429 | B2 | 8/2018 | Alameh et al. |
| 10,319,213 | B1 | 6/2019 | Conner |
| 10,389,983 | B1 | 8/2019 | Fu et al. |
| 10,418,672 | B2 | 9/2019 | Tso et al. |
| 10,708,472 | B2 | 7/2020 | Jeong et al. |
| 10,718,996 | B2 | 7/2020 | Ramones et al. |
| 11,277,941 | B1 | 3/2022 | Raghupathy et al. |
| 11,336,005 | B1 | 5/2022 | Chen et al. |
| 11,457,545 | B2 | 9/2022 | Heckmann et al. |
| 11,522,284 | B2 | 12/2022 | Grillo et al. |
| 11,646,487 | B2 | 5/2023 | Chen et al. |
| 2004/0085205 | A1 | 5/2004 | Yeh |
| 2005/0068506 | A1 | 3/2005 | Moriwaki et al. |
| 2011/0149533 | A1 | 6/2011 | Luo et al. |
| 2014/0086441 | A1 | 3/2014 | Zhu et al. |
| 2014/0253728 | A1 | 9/2014 | Glockler |
| 2015/0036036 | A1 | 2/2015 | Gao et al. |
| 2016/0043453 | A1 | 2/2016 | Ebner et al. |
| 2016/0157333 | A1 | 6/2016 | Kim et al. |
| 2016/0189502 | A1 | 6/2016 | Johnson et al. |
| 2016/0191864 | A1 | 6/2016 | Siminoff et al. |
| 2016/0284064 | A1 | 9/2016 | Morofuji |
| 2017/0048495 | A1 | 2/2017 | Scalisi |
| 2017/0339343 | A1 | 11/2017 | Zhang et al. |
| 2018/0011390 | A1 | 1/2018 | Goulden et al. |
| 2018/0013272 | A1 | 1/2018 | Germe et al. |
| 2018/0143671 | A1 | 5/2018 | Lee et al. |
| 2018/0191930 | A1 | 7/2018 | Jeong et al. |
| 2018/0261060 | A1 | 9/2018 | Siminoff et al. |
| 2018/0288292 | A1 | 10/2018 | Moggridge et al. |
| 2018/0343403 | A1 | 11/2018 | Mehdi et al. |
| 2019/0075648 | A1 | 3/2019 | Nasu et al. |
| 2019/0089872 | A1 | 3/2019 | Rukes et al. |
| 2019/0200872 | A1 | 7/2019 | Matsuoka et al. |
| 2019/0215423 | A1 | 7/2019 | Ortiz et al. |
| 2019/0342527 | A1 | 11/2019 | Siminoff |
| 2019/0373314 | A1 | 12/2019 | Collins et al. |
| 2019/0387204 | A1 | 12/2019 | Jeong |
| 2020/0249117 | A1 | 8/2020 | Lewander Xu et al. |
| 2020/0288045 | A1 | 9/2020 | Jeong et al. |
| 2020/0358908 | A1 | 11/2020 | Scalisi et al. |
| 2021/0127059 | A1 | 4/2021 | Powell et al. |
| 2022/0091484 | A1 | 3/2022 | Ali et al. |
| 2022/0110228 | A1 | 4/2022 | Raghupathy et al. |
| 2022/0159877 | A1 | 5/2022 | Raghupathy et al. |
| 2022/0231409 | A1 | 7/2022 | Chen et al. |
| 2022/0271422 | A1 | 8/2022 | Grillo |
| 2023/0032321 | A1 | 2/2023 | Grillo et al. |

FOREIGN PATENT DOCUMENTS

| | | |
|---|---|---|
| CN | 109887775 | 6/2019 |
| CN | 110891135 | 3/2020 |
| CN | 210271128 | 4/2020 |
| CN | 210924810 | 7/2020 |
| EP | 3445046 | 2/2019 |
| GB | 2369450 | 3/2002 |
| WO | 2017160906 | 9/2017 |
| WO | 2022072057 | 4/2022 |
| WO | 2023014345 | 2/2023 |

OTHER PUBLICATIONS

"Notice of Allowance", U.S. Appl. No. 17/658,213, filed Feb. 2, 2023, 8 pages.
"1080p Wi-Fi Video Doorbell", Retrieved at: https://www.lorextechnology.com/video-doorbell/1080p-full-hd-wi-fi-video-doorbell/LNWDB1-1-p—on May 28, 2021, 15 pages.
"An Essential Wireless Video Doorbell", Retrieved at: https://www.arlo.com/en-us/doorbell/video/arlo-essential-video-doorbell-wire-free.html—on May 28, 2021, 8 pages.
"Ex Parte Quayle Action", U.S. Appl. No. 17/061,872, dated Sep. 16, 2021, 9 pages.
"Extended European Search Report", EP Application No. 21193113.4, dated Feb. 4, 2022, 10 pages.
"EZViZ DB1", Retrieved at: https://www.ezvizlife.com/product/db1/960—on May 28, 2021, 9 pages.
"Foreign Office Action", TW Application No. 110136748, dated Jun. 2, 2022, 8 pages.
"International Search Report and Written Opinion", Application No. PCT/US2021/044204, dated Jan. 10, 2022, 17 pages.
"International Search Report and Written Opinion", Application No. PCT/US2021/044190, dated Apr. 13, 2022, 10 pages.
"International Search Report and Written Opinion", Application No. PCT/US2021/044194, dated Dec. 7, 2021, 12 pages.
"Invitation to Pay Additional Fees", Application No. PCT/US2021/044204, Nov. 10, 2021, 10 pages.
"Notice of Allowance", U.S. Appl. No. 17/122,449, filed Jan. 20, 2022, 9 pages.
"Notice of Allowance", U.S. Appl. No. 17/663,177, dated Aug. 9, 2022, 10 pages.
"Notice of Allowance", U.S. Appl. No. 17/061,872, filed Dec. 13, 2021, 6 pages.
Orsan, "What's Inside?—vol. 2: Dropcam Pro", https://medium.com/@candemir/whats-inside-vol-2-dropcam-pro-f458d96ecc9a, Dec. 21, 14, 23 pages.
Wu, et al., "Design of a Compact UWB MIMO Antenna without Decoupling Structure", Apr. 2018, 8 pages.
"International Preliminary Report on Patentability", Application No. PCT/US2021/044204, dated Mar. 28, 2023, 12 pages.
"Non-Final Office Action", U.S. Appl. No. 17/649,529, dated Apr. 13, 2023, 21 pages.

IMAGE-CAPTURING DOORBELL DEVICE

RELATED APPLICATIONS

This application is a continuation of and claims priority to U.S. patent application Ser. No. 17/663,177, filed on May 12, 2022, which in turn is a continuation of and claims priority to International Patent Application Serial No. PCT/US2021/044204, filed on Aug. 2, 2021, which in turn is a continuation of U.S. patent application Ser. No. 17/122,449, filed on Dec. 15, 2020, now U.S. Pat. No. 11,336,005, issued on May 17, 2022, and U.S. patent application Ser. No. 17/061,872, filed on Oct. 2, 2020, now U.S. Pat. No. 11,277,941, issued on Mar. 15, 2022, the disclosures of which are incorporated by reference herein in their entireties.

BACKGROUND

With advances in electronic doorbells for capturing images and/or videos, many users have begun to rely on their doorbell image data to determine if a package has been delivered or taken. Package detection algorithms can be applied to the doorbell data to generate and send a notification to a user if a package is detected (e.g., a package was delivered to the user's doorstep) or if a package on their doorstep is no longer detected (e.g., the package was retrieved for outgoing delivery or stolen). Further, the user can use the doorbell image data to view and/or identify a person that approached the user's doorstep.

Many conventional electronic doorbells may be large and bulky, which may decrease a user experience. Some challenges that arise in constructing an electronic doorbell with a small form factor may include thermal management, antenna isolation, interference between different sensors, and infrared (IR) flare in the camera lens.

SUMMARY

This document describes an image-capturing doorbell device. In aspects, the image-capturing doorbell device provides a compact, space-efficient, battery-powered, doorbell camera. The architecture of the image-capturing doorbell device is optimized by concentrating sensors at one end of the device and user input mechanism(s) at the opposing end of the device and including a thin and narrow middle portion between the two opposing ends. The sensors include an image sensor and a passive infrared (PIR) sensor mounted to the same printed circuit board (PCB) for space conservation. A camera lens protrudes from an outer surface of an IR window aligned with IR light-emitting diodes (LEDs) to mitigate IR flare. The PIR sensor is aligned with a lens that enhances radial motion detection by implementing two stacked rows of lenslets (e.g., Fresnel-type lenses). The user input mechanism includes a light ring formed via a two-shot molding technique with a button to bond the light ring to the button for seamless lighting integration.

According to an aspect, an image-capturing doorbell device comprises a housing and an IR cover forming an annular shape with a center aperture. The IR cover may be located on a front surface of the housing. The image-capturing doorbell device also comprises a camera module including a camera lens having an axial center that is normal to the front surface of the housing. The camera lens extends through the center aperture of the annular shape of the IR cover and protrudes from an outer surface of the IR cover by a predefined distance to mitigate IR flare.

According to an aspect, an image-capturing doorbell device comprises a housing having an elongated shape with opposing first and second ends. Each of the first and second ends may have a generally radial curvature and intersect a longitudinal axis of the housing. The housing includes a substantially planar front surface with a substantially obround shape. The image-capturing doorbell device also comprises a button positioned proximate to the second end of the housing on the front surface, the button having an elliptical shape. Also, the image-capturing doorbell device includes a light ring positioned along a perimeter of the button, the light ring configured to diffuse light generated by one or more light sources within the housing.

According to an aspect, an image-capturing doorbell device comprises a housing, an IR lens located on a front surface of the housing, and a PIR sensor positioned within the housing and aligned with the IR lens. The IR lens includes an array of lenslets each comprising a set of concentric annular sections usable to create a view cone for the PIR sensor, where the array of lenslets includes a first row of lenslets stacked above a second row of lenslets. Further, each lenslet in the first row is paired with a respective lenslet in the second row to form a pair of vertically stacked lenslets, where each pair of vertically stacked lenslets provides a pair of overlapping view cones for increased sensitivity. The lenslets in the second row of lenslets may have a larger size than the lenslets in the first row of lenslets. The PIR sensor may have increased sensitivity for motion detection through the second row of lenslets in comparison to the first row of lenslets based on the larger size of the lenslets in the second row in comparison to the lenslets in the first row. Also, the second row of lenslets may provide view cones for the PIR sensor that are focused at a downward angle relative to an axial center of the PIR sensor.

According to an aspect, an image-capturing doorbell device comprises a housing, a button, and a light ring architecture. The button has an elliptical shape, and the light ring architecture has a light ring positioned along a perimeter of the button. The light ring architecture is configured to diffuse light generated by one or more light sources within the housing. The light ring may be concentric with the button and flush with an exterior surface of the button. Also, the light ring may include a diffusive material to enable light, generated by the one or more light sources within the housing, to pass through the light ring. The light ring may be bonded to the button via a two-shot molding technique. The light ring architecture may also include a light guide positioned between one or more LEDs and the button, wherein the light guide is configured to guide the light from the one or more LEDs toward the light ring. The light ring architecture may also include a plurality of diffusive flanges that structurally support the button, are distributed around a perimeter of the light guide, and enable light exiting the light guide to travel through the plurality of diffusive flanges toward the light ring.

This summary is provided to introduce simplified concepts concerning image-capturing doorbell devices, which is further described below in the Detailed Description and Drawings. This summary is not intended to identify essential features of the claimed subject matter, nor is it intended for use in determining the scope of the claimed subject matter.

BRIEF DESCRIPTION OF THE DRAWINGS

The details of one or more aspects of an image-capturing doorbell device are described in this document with reference to the following drawings. The use of the same reference numbers in different instances in the description and the figures indicate similar elements.

DETAILED DESCRIPTION

Overview

This document describes an image-capturing doorbell device. The techniques described herein provide an image-capturing doorbell device comprising a housing, an IR cover, a button, a light ring, and a camera module. The housing has an elongated shape with opposing first and second ends, where each of the first and second ends have a generally radial curvature and intersect a longitudinal axis of the housing. The housing also includes a substantially planar front surface with an approximately obround shape. The IR cover forms an annular shape with a center aperture. The IR cover is located on the front surface of the housing and proximate to the first end. The button is positioned proximate to the second end of the housing on the front surface, the button having an elliptical shape. The light ring is positioned along a perimeter of the button and configured to diffuse light generated by a light source within the housing. The camera module is positioned proximate to the first end of the housing. The camera module includes a camera lens having an axial center that is substantially normal to the front surface of the housing. Also, the camera lens extends through the center aperture of the annular shape of the IR cover and protrudes from an outer surface of the IR cover by a predefined distance to mitigate IR flare.

The IR cover includes a PIR lens having an array of lenslets, where each lenslet forms at least part of a Fresnel lens. The array of lenslets includes two stacked rows of the lenslets for enhanced radial motion detection. For example, the two stacked rows of lenslets provide pairs of vertically overlapping view cones with the PIR sensor being biased for increased sensitivity in a bottom view cone of the pair of view cones. Further, the bottom view cone is focused at a downward angle from horizontal (and below a top view cone of the pair of view cones).

For space conservation, the image-capturing doorbell device also includes an image sensor and a PIR sensor mounted to a same surface of a PCB, with separate ground planes that are separated by a physical cutout in the PCB. In addition, the image-capturing doorbell device also includes a light ring architecture that allows a relatively large button with waterproofing and a bright light ring. In aspects, the light ring architecture includes diffusive flanges that structurally support the button and enable light to pass through the diffusive flanges toward the light ring to exit the housing.

While features and concepts of the described image-capturing doorbell device can be implemented in any number of different environments, aspects are described in the context of the following examples.

Example Device

Figure 1:
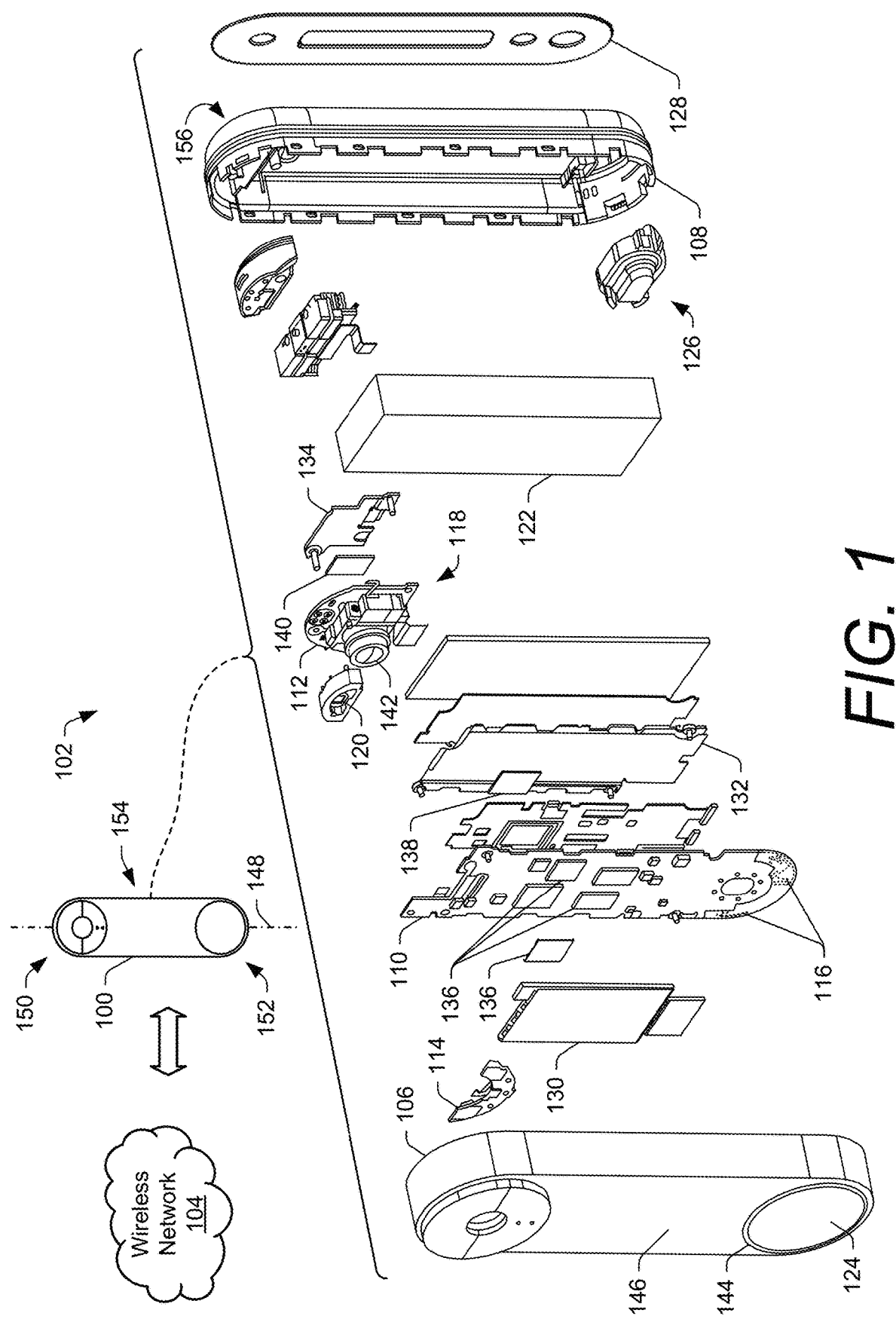
FIG. 1 illustrates an example electronic device and an exploded view of some components thereof.

FIG. 1 illustrates an example electronic device 100 (e.g., a doorbell camera) and an exploded view 102 of some components thereof. The electronic device 100 may connect to a wireless network 104 (e.g., via a wireless router) and support a variety of functions, including capturing audio and/or video data (including images or streaming video), transmitting the captured data to online storage, storing the captured data to local memory, streaming audio (e.g., music, news, podcasts, sports), and interacting with a virtual assistant to perform tasks (e.g., search the internet, schedule events and alarms, control home automation, control internet-of-things (IoT) devices), and so on.

The electronic device 100 includes a housing formed by one or more housing members, including a front housing member 106 (e.g., a front cover) and a rear housing member 108 (e.g., a back component), and multiple PCBs including at least a main logic board (MLB) 110, a sensor PCB 112, and an IR PCB 114. Additional PCBs may also be used. The PCBs may include various integrated circuit (IC) components, including system-on-chip (SoC) devices, processors, and IC components for LEDs, microphone(s), or sensors for detecting input such as touch-input, a button-press, motion, light, or a voice command In an example, an SOC device and an antenna system 116 may be mounted on the MLB 110. Further, a camera module 118 (e.g., camera) and a PIR sensor 120 may both be mounted to the sensor PCB 112. Also, one or more IR LEDs may be mounted to the IR PCB 114 to provide IR light for, e.g., motion detection by the PIR sensor 120. The electronic device 100 also includes a battery 122, a user-input mechanism (e.g., button 124), a speaker module 126, and a wallplate 128. In addition, the electronic device 100 includes a thermal-control system, which may include one or more heat spreaders (e.g., heat spreaders 130, 132, and 134) and one or more thermal interface materials (TIMs) (e.g., TIMs 136, 138, and 140) such as thermal gel, thermal paste, thermal adhesive, thermal tape) with high thermal conductivities. In some aspects, the heat spreader 130 may double as an electromagnetic interference (EMI) shield for SoC devices mounted on the MLB 110.

The housing members 106 and 108 may include a plastic material and be formed, for example, using plastic-injection molding techniques. The housing members 106 and 108 may include any suitable geometry, including the example geometry illustrated in FIG. 1. For instance, the front housing member 106 and the rear housing member 108 may form complementary portions of a shell (e.g., a hollow, substantially obround shell) that fit together (e.g., snap together) to form a cavity to house various components of the electronic device 100. In some implementations, the front housing member 106 and/or the rear housing member 108 may include multiple parts assembled together. The front housing member 106 may also include an aperture that is aligned with a camera lens 142 of the camera module 118 to enable the camera module 118 to view through the aperture and capture images or video of a scene. As described in more detail herein, the lens 142 may extend through the aperture in the front housing member 106 so as to protrude from an outer surface of the front housing member 106 by a predefined distance to reduce or prevent IR flare (e.g., IR light leakage into the camera lens 142 from the IR LEDs on the IR PCB 114).

The button 124 may include any suitable button (e.g., a mechanical button to open or close a switch, a capacitive sensor to detect user touch) usable to initiate a function. For example, actuation of the button 124 may initiate a function, including a ringing of an audible doorbell, transmission of an electronic notification to a smartphone of the doorbell's owner, initiation of the camera module 118, and so on. Any suitable function can be initiated by activating the button 124. The button 124 may be aligned with the MLB 110 to reduce space and maintain a small form factor for the electronic device 100. The button 124 can have an outline that is any suitable two-dimensional shape, including an elliptical shape, a rectangular shape, or any other polygonal shape. In aspects, the elliptical shape may have a circular shape in which its two focal points are equal.

As described in further detail herein, the button 124 includes a light ring 144 positioned along a perimeter of the button 124. In aspects, the light ring 144 is concentric with the button 124 and provides a cosmetic outline to the button 124. The light ring 144 is configured to enable light (e.g., light generated by one or more LEDs mounted on the MLB 110 and positioned to fire toward a backside of the button 124) to exit the housing through the front housing member 106. As light passes through the light ring 144, which encircles the button 124, the light can be used to indicate the location of the button and provide visual feedback to a user (e.g., by increasing and/or decreasing luminance, flashing, changing color).

The speaker module 126 may output audio waves toward a front and/or sides (e.g., lateral sides that are orthogonal to a front surface 146 of the front housing member 106) of the electronic device 100. The speaker module 126 can enable a person (e.g., a user pressing the button 124) to listen to an audible message, including a recorded audio message or a real-time audio transmission from the doorbell's owner.

The battery 122 provides power to the electronic device 100 and enables the electronic device 100 to be wireless. Because the electronic device 100 is battery powered, the electronic device 100 can be mounted in any suitable location, without having to hardwire the electronic device 100 to an electric power source. For example, the electronic device 100 (e.g., video-recording doorbell) can be mounted on a user's house proximate to their front door without having to drill holes in the house to connect wires to a power source inside the house.

The PCBs (e.g., the MLB 110, the sensor PCB 112, the IR PCB 114) may be formed, for example, from glass-reinforced epoxy material such as FR4. In some instances, the PCBs may include a single layer of electrically conductive traces and be a single-layer board. In other instances, the PCBs may be a multi-layer board that includes multiple layers of electrically conductive traces that are separated by layers of a dielectric material.

As described herein, the housing of the electronic device 100 includes an elongated shape (e.g., substantially obround in front view) having a longitudinal axis 148 intersecting first and second opposing ends of the housing, where each end has a generally radial curvature. In an example, each of the first and second opposing ends is curved about at least one axis that is substantially orthogonal to the longitudinal axis 148. The camera module 118 is positioned proximate to the first end (e.g., a camera-side end 150) of the electronic device 100. For example, an optical axis of the camera module 118 may be aligned with a radial center of the curvature of the camera-side end 150 of the electronic device 100. The button 124, the antenna system 116, and the speaker module 126 are positioned proximate to the second end (e.g., a button-side end 152) of the housing. For example, a center axis of the button 124 may be aligned with a radial center of the curvature of the button-side end 152 of the electronic device 100. In one aspect, an edge of the button 124 may be located within a range of 0.5 millimeters (mm) to 2 mm from the edge of the second end of the housing, including, e.g., 1.0 mm. When the electronic device 100 is assembled, the battery 122 is positioned between the camera-side end 150 and the button-side end 152 and within a middle portion 154 of the housing.

The antenna system 116 may be any suitable antenna system mounted on a PCB (e.g., the MLB 110). For example, the antenna system 116 may include conductive trace (e.g., copper) forming one or more antennas (e.g., a dual-antenna system). As such, the antennas of the antenna system 116 may be printed on the MLB 110. In aspects, the antennas of the antenna system 116 may be printed on a side of the MLB 110 that faces the button 124 and which also includes one or more IC components (e.g., SoC) mounted thereon. The antenna system 116 may be located proximate to the button-side end 152 of the electronic device 100. Positioning the antenna system 116 at the button-side end 152 reduces negative effects on antenna efficiency caused by the camera module 118. To reduce adverse effects of the wallplate 128 on the antenna performance and efficiency, the MLB 110 on which the antenna system 116 resides is positioned proximate to the front housing member 106 such that the antenna system 116 is positioned between the battery 122 and the front housing member 106. Accordingly, the battery 122 is located between the MLB 110 and the rear housing member 108, and the rear housing member 108 is positioned between the battery 122 and the wallplate 128. Accordingly, the wallplate 128 can be mounted to a rear exterior surface 156 of the rear housing member 108, where the rear exterior surface 156 is opposite the front surface 146 of the front housing member 106 when the rear housing member 108 is assembled to the front housing member 106.

Figure 2:
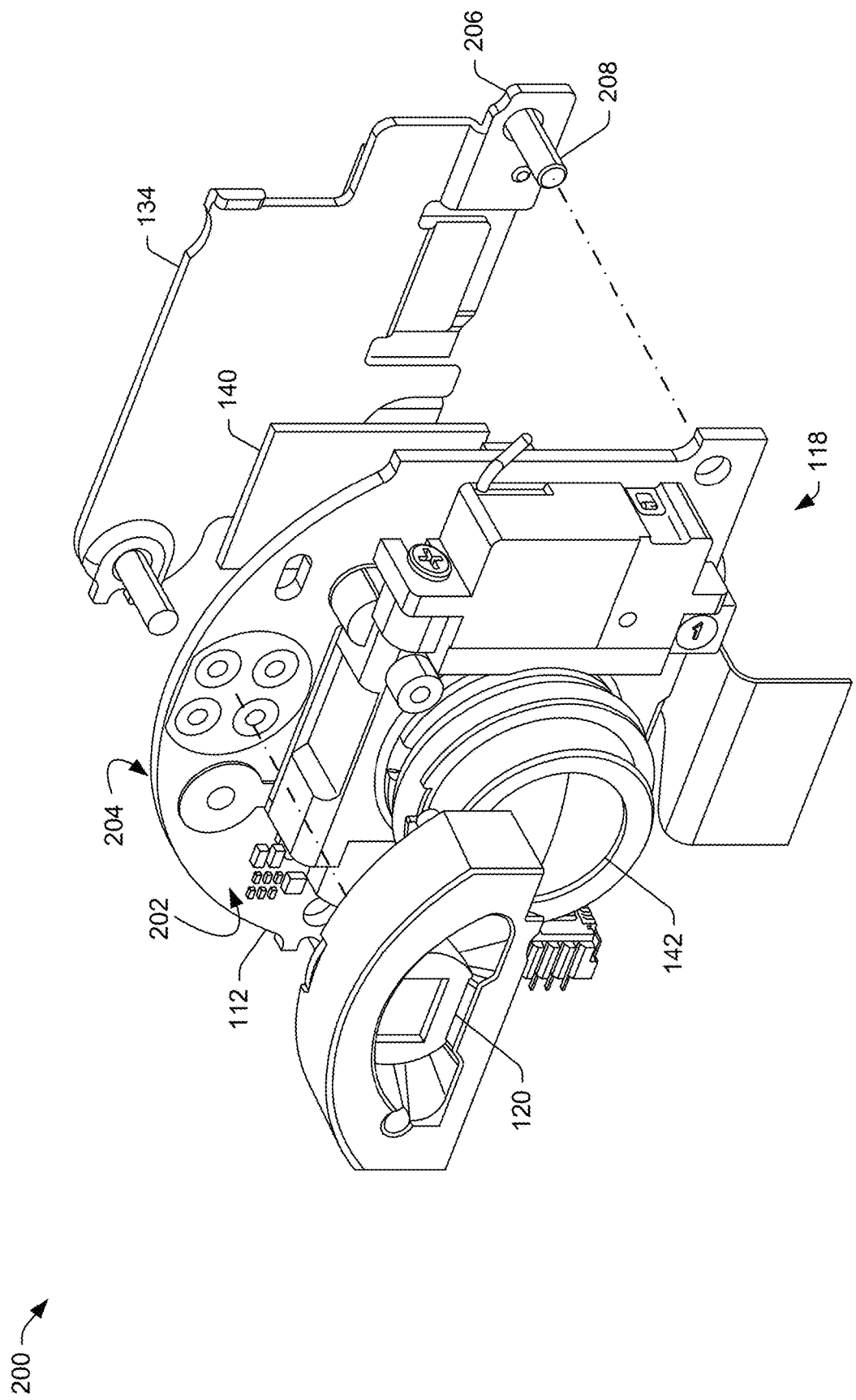
FIG. 2 illustrates an exploded view of some components of the electronic device in FIG. 1, including a camera module and a PIR sensor.

FIG. 2 illustrates an exploded view 200 of some components of the electronic device 100 in FIG. 1, including the camera module 118 and the PIR sensor 120. The exploded view 200 illustrates the sensor PCB 112 having a first surface 202 and an opposing, second surface 204. The PIR sensor 120 and the camera module 118 are mounted to the first surface 202 of the sensor PCB 112. In particular, an image sensor (not shown in FIG. 2) of the camera module 118 is mounted to the sensor PCB 112. The image sensor is positioned behind the camera lens 142 to capture image data of a scene within a field of view of the camera lens 142.

The exploded view 200 also illustrates the TIM 140 positioned between the heat spreader 134 and the second surface 204 of the sensor PCB 112. In an assembled state, the TIM 140 is in thermal contact with the sensor PCB 112 and the heat spreader 134. In particular, the TIM 140 is positioned proximate to the second surface 204 of the sensor PCB 112, directly opposite the camera module 118. With this arrangement, the TIM is configured to transfer heat away from the camera module 118 and to the heat spreader 134, which transfers the heat to a heatsink and/or to the housing of the doorbell camera.

In some instances, the heat spreader 134 may include one or more flange(s) 206 and/or one or more alignment pin(s) 208. The flange(s) 206 and the alignment pin(s) 208, in some instances, may position the heat spreader 134 relative to the sensor PCB 112 such that thermal contact between features of the sensor PCB 112 and the heat spreader 134 is optimized (e.g., for thermal conduction). In some instances, the flange(s) 206 may also perform as mechanical standoffs that are conducive to a desired thickness and/or compression of the TIM 140.

In some aspects, the TIM 140 may include a thermal pad. Examples of the thermal pad include a preformed solid material that is silicone or paraffin wax-based. The TIM 140 may provide a conductive path for heat generated by the PIR sensor 120 and the image sensor of the camera module 118 to the heat spreader 134, which may transfer the generated heat through convection and/or radiation to other elements (e.g., the first housing component 106 and/or to the second housing component 108 illustrated in FIG. 1). In some instances, a hybrid graphite sheet (not illustrated in FIG. 2) may also adhere to one or more surfaces of the heat spreader 134.

Figure 3:
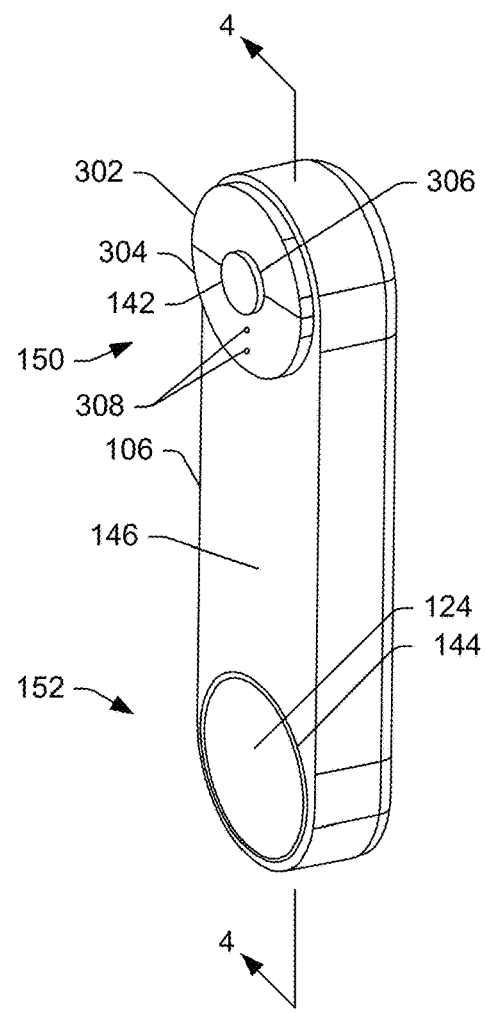
FIG. 3 illustrates an isometric view of the electronic device in FIG. 1 in an assembled configuration.

FIG. 3 illustrates an isometric view 300 of the electronic device 100 in FIG. 1 in an assembled configuration. The camera-side end 150 of the electronic device 100 includes the IR cover protruding from the first surface 146 of the electronic device 100. For example, the IR cover includes a PIR lens 302 and an IR window 304. The PIR lens 302 and the IR window 304 together form an annular shape (e.g., ring shape with an outer diameter and an inner diameter) defining a center aperture 306. The PIR lens 302 and the IR window 304 may be separate components assembled together or positioned proximate to one another. In another example, the PIR lens 302 and the IR window 304 may be different portions of a single component or may be bonded together to form a single component. When the electronic device 100 is assembled, the camera lens 142 of the camera module 118 (in FIG. 2) extends through the center aperture 306 and protrudes from an outer surface of the PIR lens 302 and the IR window 304. In aspects, the camera lens 142 is positioned relative to surrounding components such that an axial center of the camera lens 142 is substantially normal to the front surface 146 of the housing 106.

The IR window 304 may include an IR translucent material, which enables IR light from the IR LEDs on the IR PCB 114 (in FIG. 1) to travel through the IR window 304. In another example, the IR window 304 may (i) include an IR opaque material to prevent IR light from passing through the material itself and (ii) define one or more apertures 308 through which the IR LEDs may provide the IR light. The IR opaque material may prevent the IR light from leaking into the camera lens 142 of the camera module 118.

The PIR lens 302 may include an IR translucent material, which enables IR light reflecting off of one or more objects to pass through the PIR lens 302. The PIR sensor 120 (in FIG. 2) is positioned behind the PIR lens 302 and can receive the IR light passing through the PIR lens 302 in order to detect motion of an object. The PIR lens 302 may include any suitable lens usable by the PIR sensor 120 to receive IR reflections, an example of which includes a Fresnel lens.

At the button-side end 152 of the electronic device 100, the button 124 and the light ring 144 may be substantially flush with the front surface 146 of the electronic device 100. The button 124 and/or light ring 144 may have a shape and/or size that substantially matches the outline and/or size of the IR cover (e.g., the PIR lens 302 and the IR window 304). In an example, the button 124 may have a diameter that is substantially equal to the outer diameter of the IR cover at the camera-side end 150. In another example, the light ring 144 has an outer diameter that is substantially the same as the outer diameter of the IR cover.

Figure 4:
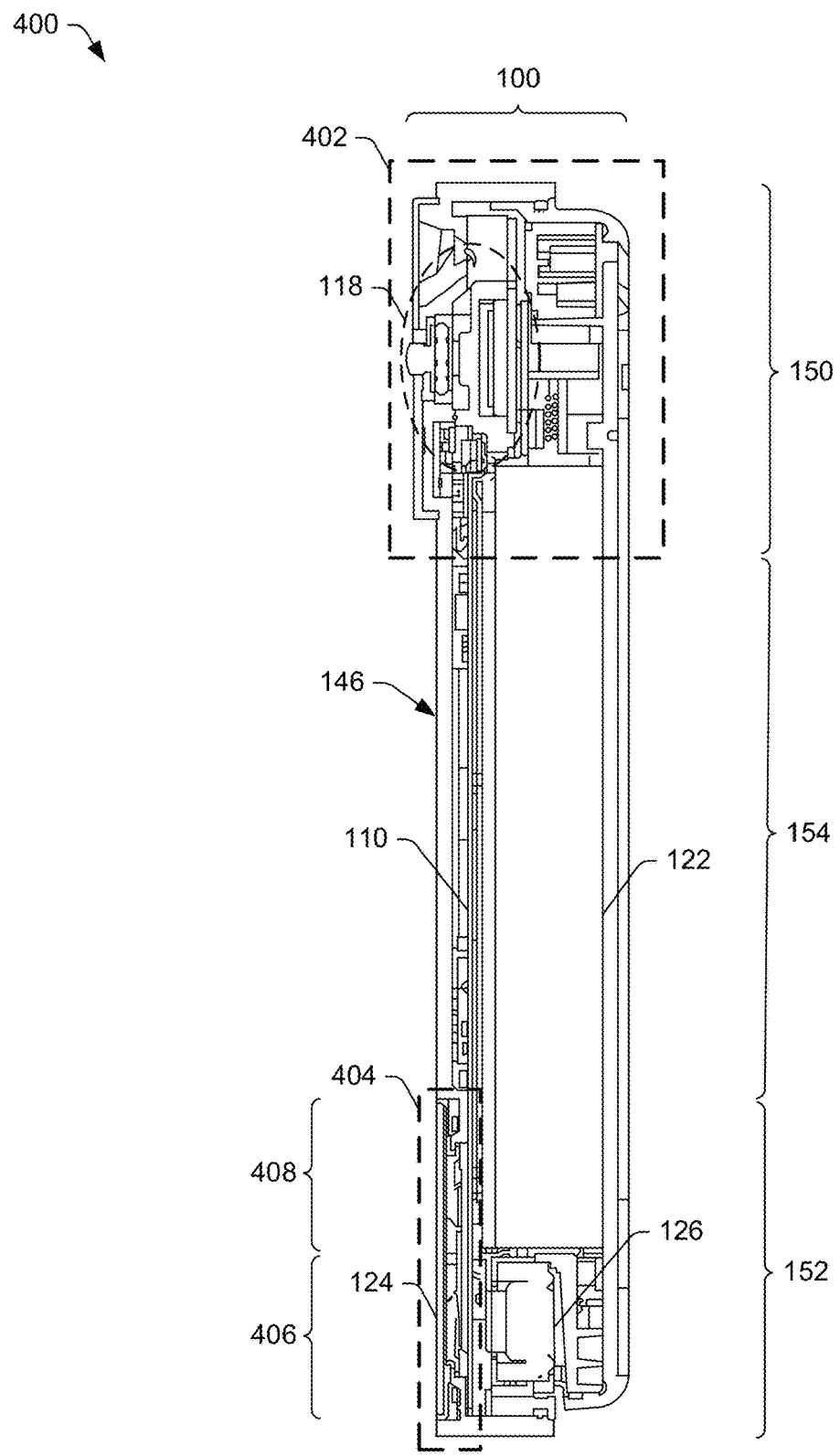
FIG. 4 illustrates a sectional view of the electronic device in FIG. 3, taken along line 4-4.
Figure 5:
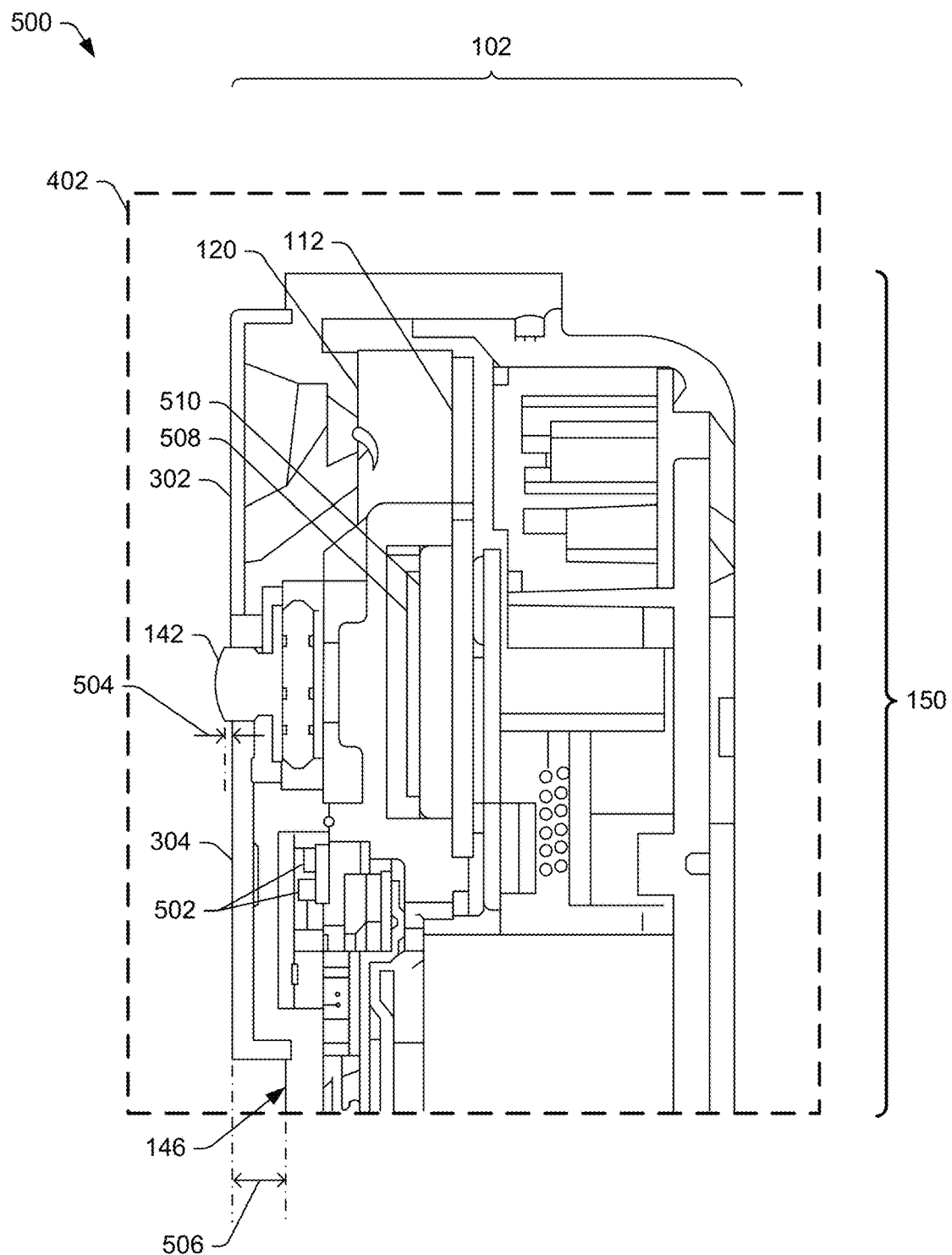
FIG. 5 illustrates an enlarged view of a first portion (e.g., camera-side end) of the sectional view of the electronic device in FIG. 4.
Figure 7:
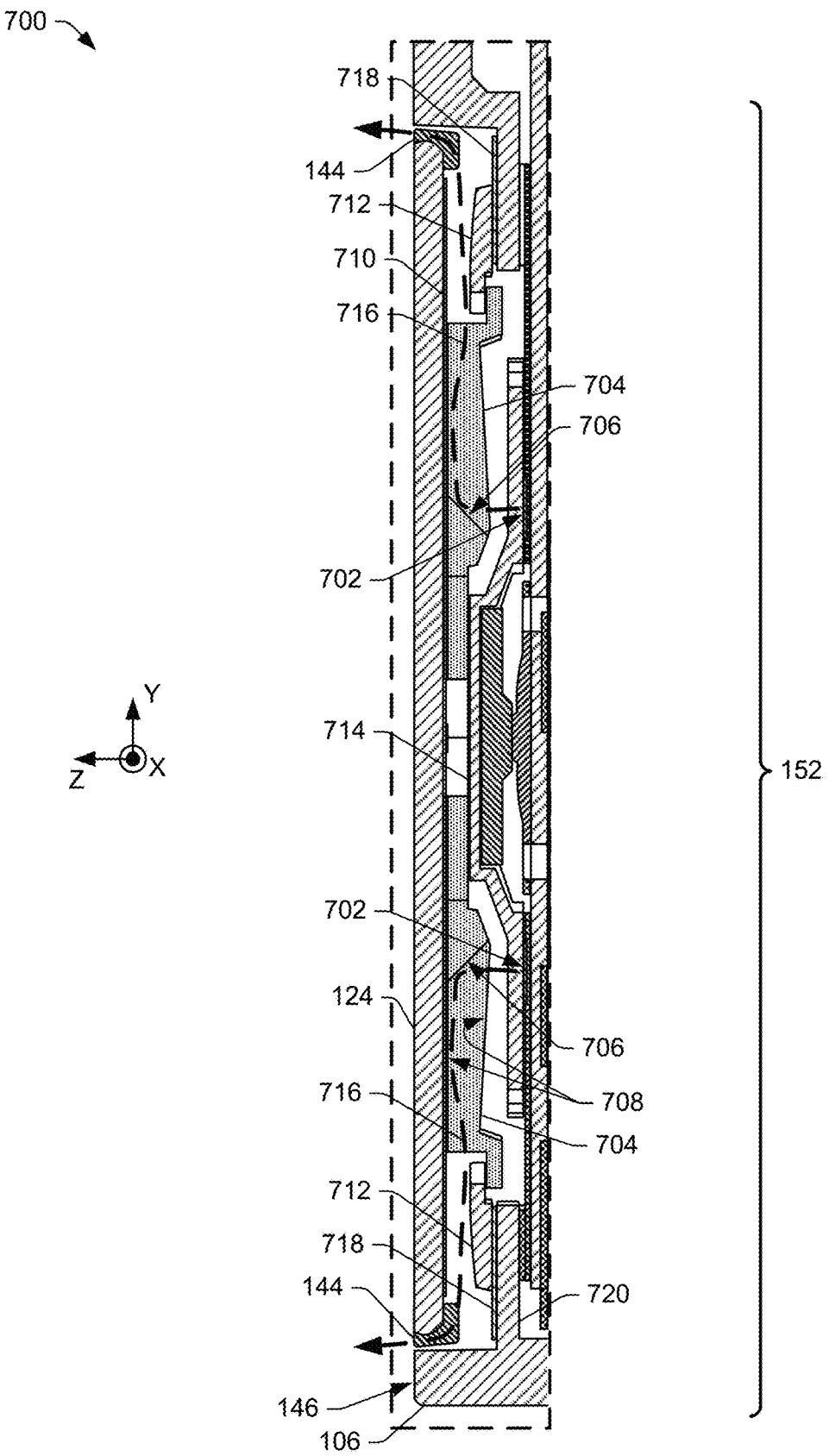
FIG. 7 illustrates an enlarged view of a second portion (e.g., button-side end) of the sectional view of the electronic device in FIG. 4.

FIG. 4 illustrates a sectional view 400 of the electronic device 100 in FIG. 3, taken along line 4-4. A first portion 402 (e.g., the camera-side end 150) of the sectional view 400 of the electronic device 100 in FIG. 4 is illustrated in FIG. 5. A second portion 404 (e.g., the button-side end 152) of the sectional view 400 of the electronic device 100 in FIG. 4 is illustrated in FIG. 7.

As illustrated in FIG. 4, the speaker module 126 is aligned with a portion (e.g., lower portion 406) of the button 124, with the MLB 110 positioned between the speaker module 126 and the button 124. Another portion (e.g., upper portion 408) of the button 124 is aligned with, or overlaps, the battery 122 in a direction (e.g., horizontal direction) that is orthogonal to a plane defined by the front surface 146, with the MLB 110 positioned between the button 124 and the battery 122. The battery 122 is positioned in the middle portion 154 of the housing and extends partially into the camera-side end 150 and the button-side end 152. Further, the battery 122 is positioned lengthwise between the speaker module 126 in the button-side end 152 and the camera module 118 in the camera-side end 150. Further details of the camera-side end 150 are described with respect to FIG. 5.

FIG. 5 illustrates an enlarged view 500 of the first portion 402 (e.g., the camera-side end 150) of the sectional view 400 of the electronic device 100 in FIG. 4. As illustrated, the camera lens (e.g., camera lens 142) is positioned between the IR window 304 and the PIR lens 302. Accordingly, the camera lens 142 is positioned between IR LEDs 502, which are configured to provide IR light to pass through the IR window 304, and the PIR sensor 120, which is configured to receive IR light that reflects off of an object and passes through the PIR lens 302. The camera lens 142 protrudes from an exterior surface of the IR cover (e.g., the PIR lens 302 and the IR window 304) by a first distance 504. Accordingly, the camera lens 142 is not positioned behind a cover material (e.g., cover glass), resulting in fewer components and reduced manufacturing costs. The first distance 504 is predefined based on characteristics (e.g., FOV) of the camera lens 142 and the proximity and relation of the camera lens 142 to the IR window 304. For example, the first distance 504 is sufficient to mitigate IR flare (e.g., IR light traveling through the IR window 304 and leaking into the camera lens 142). In an aspect, the first distance 504 is within a range of 0.1 mm to 0.5 mm In this way, the IR light traveling through the IR window 304 cannot pass into the camera lens. The first distance 504 may be greater for a 160° lens than for, e.g., a 140° lens.

The middle portion 154 (shown in FIG. 4) is narrower in a front-to-rear dimension than that of the camera-side end 150. For example, the IR cover (e.g., the PIR lens 302 and the IR window 304) protrudes from the front surface 146 of the front housing member 106 by a second distance 506. The second distance 506 may be any suitable distance sufficient to enable the middle portion 154 and the button-side end 152 (shown in FIG. 4) to be as thin as possible while providing sufficient interior space for the camera module 118 and the PIR sensor 120 in the camera-side end 150.

The camera module 118 includes an image sensor 508 mounted to the sensor PCB 112. As described further herein, the PIR sensor 120 and the image sensor 508 are mounted to the same PCB (e.g., the sensor PCB 112). Further, both the PIR sensor 120 and the image sensor 508 are mounted to the same surface (e.g., the first surface 202) of the sensor PCB 112. In aspects, the image sensor 508 may be mounted to a substrate 510, which is mounted directly to the sensor PCB 112.

In general, image sensors (for image capture) and PIR sensors (for motion detection) each use a lens to perform their respective function well. Each sensor-and-lens combination has a different focal length. Mounting the PIR sensor 120 and the image sensor 508 to the same PCB improves space efficiency and cost efficiency over conventional devices that use different PCBs and planes for the image sensor and PIR sensor. However, if both sensors are mounted on the same PCB, then the focal length of both of the sensor-and-lens combinations may require coordination with one another, which is non-trivial because both sensors are independent but located on the same plane and their respective lenses are also on a same plane with one another.

Figure 6:
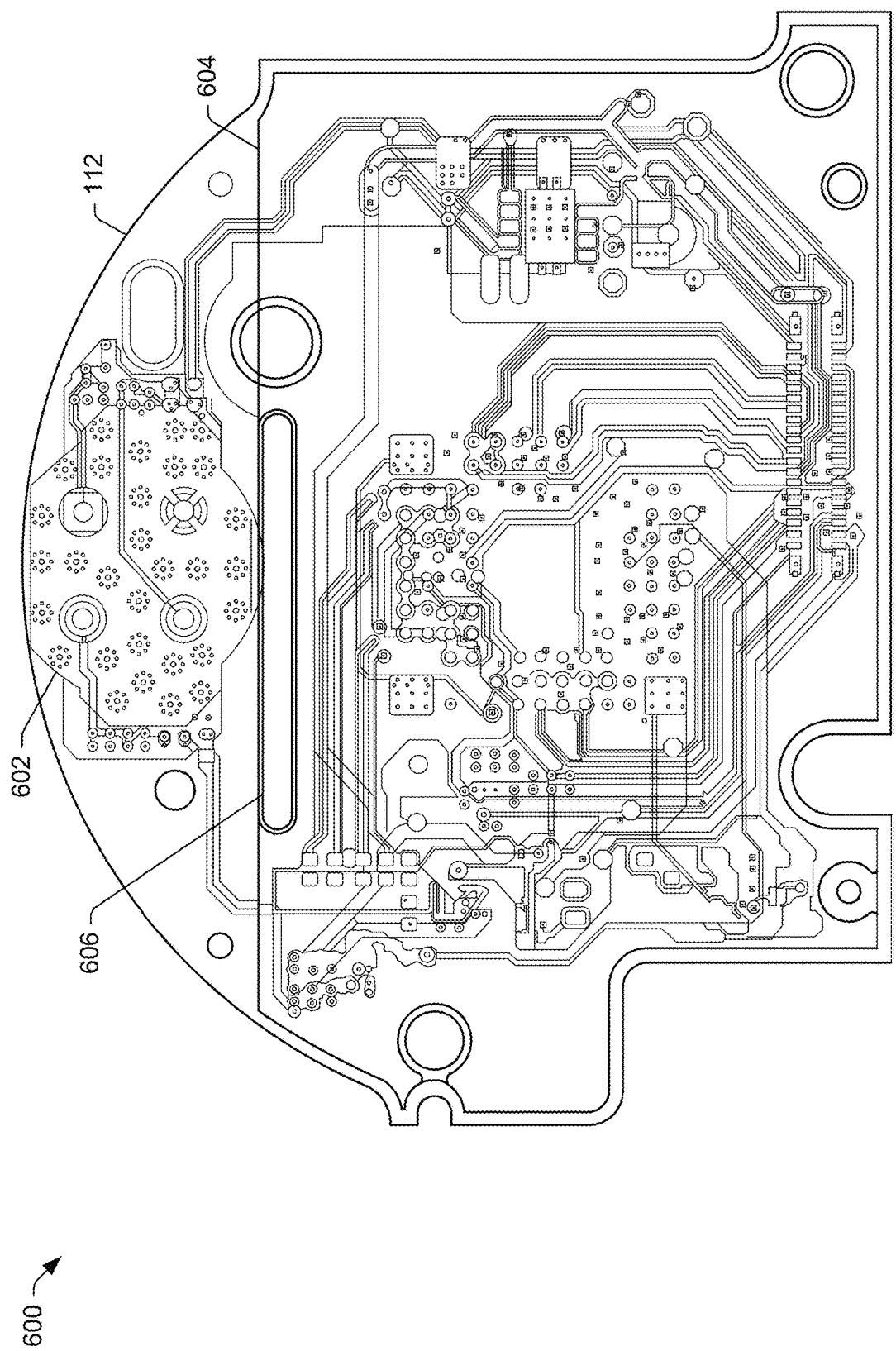
FIG. 6 illustrates an example implementation of the sensor printed circuit board in FIG. 1.

FIG. 6 illustrates an example implementation 600 of the sensor PCB 112 in FIG. 1. The PIR sensor 120 (in FIGS. 1, 2, 4, and 5) is sensitive to heat, not only from absolute steady state temperatures, but also from thermal load(s) from a transient perspective, to the point that certain fast transient thermal loads can cause significant damage to the PIR sensor 120. For example, a transient thermal load of greater than, e.g., one Kelvin/second temperature rise may cause significant damage to the PIR sensor 120. When an object is detected and the image sensor 508 is activated (e.g., turned on), the image sensor 508 dissipates power (e.g., approximately 290 milliwatts of power), which generates heat. To provide a buffer and prevent the heat from reaching the PIR sensor 120, the sensor PCB 112 includes recessed ground planes and a physical cutout (e.g., aperture). Plane separations and the physical cutout in the sensor PCB 112 isolate the heat from PIR sensor 120.

In the illustrated example, the sensor PCB 112 includes a first ground plane 602 and a second ground plane 604 that is thermally isolated from the first ground plane 602. In an example, metal layering features that form the first ground plane 602 and the second ground plane 604 are independent of one another with no shared metallic paths to conduct electrical and/or thermal energy. In addition, the sensor PCB 112 defines a cutout (e.g., slot 606) that thermally separates the first ground plane 602 from the second ground plane 604. As illustrated, the slot 606 is oriented lengthwise in a direction substantially orthogonal to a line connecting the first ground plane 602 to the second ground plane 604.

The first ground plane 602 and the second ground plane 604 are ground planes for different sensors. For example, the first ground plane 602 may be a ground plane for a PIR sensor (e.g., the PIR sensor 120 in FIGS. 1 and 2) and the second ground plane 604 may be a ground plane for an image sensor (e.g., the image sensor 508 in FIG. 5). Due to the thermal isolation of the first ground plane 602 from the second ground plane 604, transfer of heat between sensors is significantly reduced or prevented. In some instances, the first ground plane 602 and the second ground plane 604 may be formed from a material that has a thermal conductivity and/or a thermal capacitance (e.g., a copper material).

FIG. 7 illustrates an enlarged view 700 of the second portion 404 (e.g., the button-side end 152) of the sectional view 400 of the electronic device 100 in FIG. 4. Here, the button 124 includes a light ring architecture with a light ring (e.g., the light ring 144) integrated with the button 124. The button 124 and the light ring architecture together have a small z-stack but a relatively large outer diameter. The light ring architecture may include an array of LEDs 702 and a light guide 704. A light path (e.g., path for light, generated by the array of LEDs 702, to travel) is shared with a button travel area (e.g., area within the housing for the button 124 to travel when acted upon by an exterior compression force).

The LEDs 702 may be top-firing LEDs that fire toward the light guide 704 positioned on a backside of the button 124. Any suitable number of LEDs can be implemented, including 4, 5, 6, 7, 8, 9, 10, and so forth. In one example, eight LEDs are implemented, which may have an intensity substantially within a range of 500 to 3000 millicandela (mcd).

The light guide 704 is positioned directly above (e.g., in a z-direction) the array of LEDs 702. In aspects, the light guide 704 has total internal reflection (TIR) for light at a 45° surface 706 and also has TIR on the internal sides (e.g., internal sides 708) of the exterior surfaces of the light guide 704. In addition, a reflective material (e.g., reflection tape 710) may be positioned between the light guide 704 and the button 124 to decrease light leakage and increase optical efficiency. In the illustrated example, the reflection tape 710 is located on an opposite side of the light guide 704 from the array of LEDs 702.

The light ring architecture also includes multiple diffusive flanges 712, which are diffusive and transmissive of light. In aspects, the diffusive flanges 712 are transparent to enable light to travel through. The diffusive flanges 712 do not block the light from exiting through the light ring 144. Any suitable number of the diffusive flanges 712 may be implemented around a perimeter of the light guide 704, including 2, 3, 4, and so forth. The diffusive flanges 712 may counteract hot spots based on the diffusive resin used to form the diffusive flanges 712 as well as their geometry. Further, the diffusive flanges 712 structurally support the button 124 (e.g., "snap" fit to the light guide 704 to support the button 124 in place). The diffusive flanges 712 provide a resistive force against the light guide 704 in a direction toward the interior of the electronic device 100 while a flexible button component 714 applies a biasing force against a center area of the light guide 704 in an opposite direction (e.g., a direction outward toward the backside of the button 124). When the button 124 is pressed, the flexible button component 714 may be moved in a direction normal to the MLB 110 and directly connect to a switch on the MLB 110 to open or close the switch. Directly connecting the button 124 and its components to the MLB 110 enhances space conservation in the architecture of the electronic device 100.

The light ring 144 is formed via a two-shot molding technique with the button 124. In particular, the button 124 is a first shot of plastic material and the light ring 144 is a second shot of plastic material, which is diffusive and formed into a ring around the button 124 (in a front view). In aspects, the light ring 144 is flush with an exterior surface of the button 124. The button 124 and the light ring 144 may be flush with the front surface 146 of the front housing member 106. Using the two-shot molding technique, the light ring 144 and the button 124 are chemically bonded together with no gap or seam existing between them, which reduces the number of parts included and also enhances waterproofing. The light ring 144 may have any suitable width (e.g., distance between an inner diameter and an outer diameter). An example width of the light ring 144 includes a width substantially within a range of 0.25 mm to 1.0 mm, including a width of 0.5 mm. The light generated by the array of LEDs 702 exits through the light ring 144.

Arrows 716 represent a general path of the light generated by the array of LEDs 702. For example, the light is fired from the LEDs 702 directly into the light guide 704 (e.g., in a z-direction), reflects off of the 45° surface 706 within the light guide 704, and travels in a direction toward the perimeter of the light guide 704 (and toward the perimeter of the button 124). The light continues to travel through the light guide 704, reflecting off of the internal sides 708 of the light guide 704. The light may continue through and/or around the diffusive flange 712 toward the light ring 144. The light ring 144 diffuses the light and the diffused light exits the light guide 704 toward the exterior of the housing.

In addition, a reflective material 718 (e.g., polyethylene terephthalate (PET)) may be positioned between the diffusive flange 712 and a structural support 720 of the housing (and between the structural support 720 and the light ring 144). The reflective material 718 reduces light leakage by reflecting the light toward the light ring 144.

Figure 8:
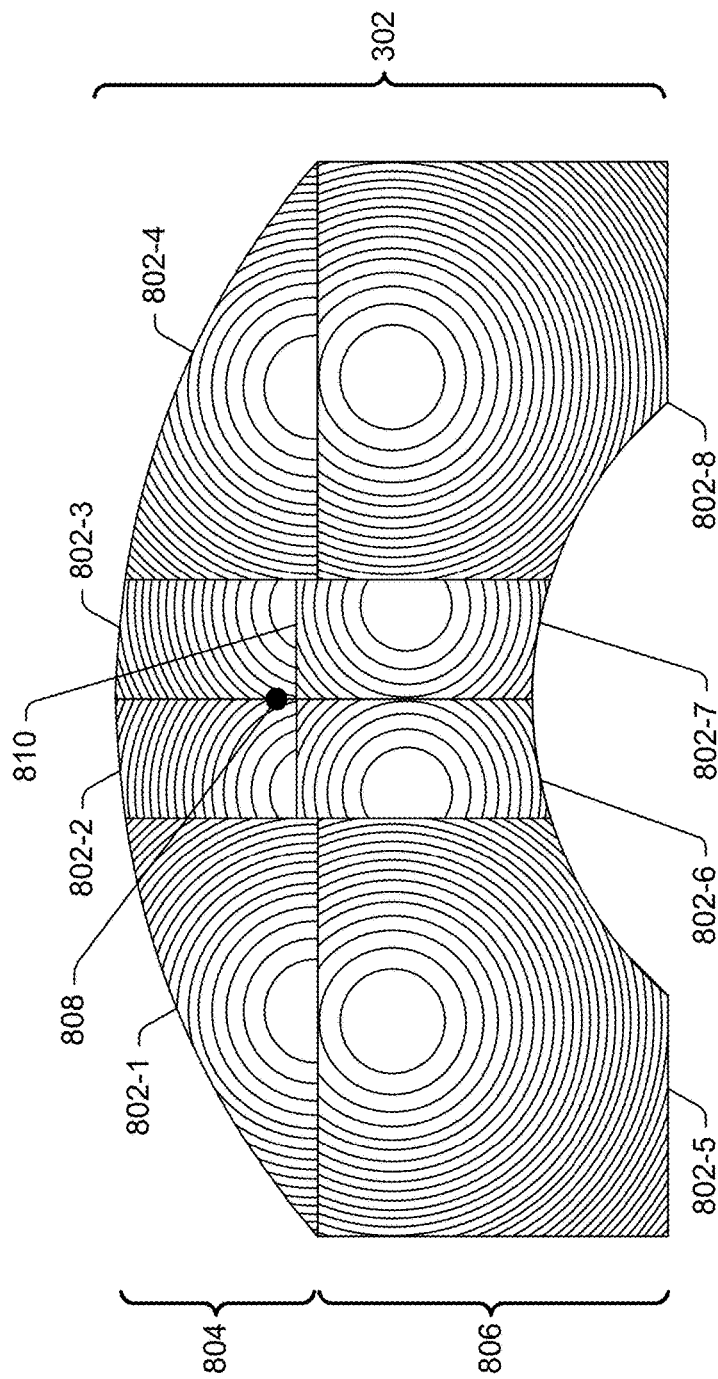
FIG. 8 illustrates a rear elevational view of an example implementation of the PIR lens in FIG. 3.

FIG. 8 illustrates a rear elevational view 800 of an example implementation of the PIR lens 302 in FIG. 3. Typical motion sensors have high detection capabilities for objects moving laterally (e.g., left to right or right to left from the sensor's perspective) across the sensor's FOV. This lateral movement may be referred to as tangential motion. In contrast, conventional motion sensors have lower detection capabilities for objects moving directly toward (or away from) the sensor, which is referred to herein as radial motion.

In the illustrated example, the PIR lens 302 includes features of a Fresnel lens, which enhances the FOV of the PIR sensor 120 (in FIG. 1). In particular, the PIR lens 302 described herein enables (i) enhanced radial motion detection for adults, assuming a flat approach to the electronic device 100, (ii) enhanced radial motion detection for adults when there are stairs leading up to the electronic device 100, and (iii) motion detection (tangential and radial) for children.

Continuing, the PIR lens 302 includes an array of lenslets 802 (e.g., lenslets 802-1 to 802-8). Each lenslet 802 includes a set of concentric annular sections forming at least a portion of a Fresnel lens. From the perspective of the PIR sensor 120, a lenslet 802 provides a narrower FOV than the sensor FOV. Using multiple lenslets 802 creates multiple separate small FOVs for the PIR sensor 120, which are referred to as view cones. Depending on the arrangement of the lenslets 802, adjacent view cones may overlap or have a gap between them. Further details of the view cones is described below with respect to FIG. 9.

As illustrated in FIG. 8, the PIR lens 302 includes multiple rows of lenslets 802, including a first row 804 (e.g., lenslets 802-1, 802-2, 802-3, and 802-4) stacked above a second row 806 (e.g., lenslets 802-5, 802-6, 802-7, and 802-8). A single row of lenslets 802 enhances a horizontal FOV for the PIR sensor 120 and is effective at detecting tangential motion but is less efficient at detecting radial motion because the PIR sensor 120 detects changes in incident heat. Generally, a person approaching radially (e.g., directly toward the PIR sensor 120) provides a slow change in incident heat and the PIR sensor 120 responsively provides a low signal corresponding to the slow change in incident heat. By implementing the first row 804 of lenslets 802 together with the second row 806 of lenslets 802, detection of radial motion is significantly enhanced. In aspects, the PIR sensor 120 detects a more rapid change of incident heat corresponding to the radially approaching person through the second row 806 of lenslets 802 than through the first row 804 of lenslets 802 due to the second row 806 of lenslets being focused at a downward angle from horizontal and due to detection of more and more of the person's body as they approach the electronic device 100 (e.g., feet are detected first, then additionally legs, then additionally torso). As described in more detail herein, the second row 806 of lenslets 802 also enhances motion detection for shorter people (e.g., children) or a person approaching from below coming up stairs, e.g., on a porch.

The PIR sensor 120 may be aligned with the PIR lens 302 at location 808 to provide an optimal FOV for the PIR sensor 120 when the electronic device 100 is mounted at a reasonable height for a doorbell. Notice that the location 808 of sensor alignment is offset from a dividing line 810 between lenslets 802-2 and 802-6 (and between lenslets 802-3 and 802-7). This offset, combined with a distance (e.g., focal length) between the PIR lens 302 and the PIR sensor 120, defines the direction of a view cone created by a respective lenslet 802. Further, the PIR sensor 120 may have multiple (e.g., two) sensor elements arranged side-by-side horizontally relative to the PIR lens 302. Using two sensor elements doubles the number of view cones relative to the number of lenslets 802. In the illustrated example, the PIR lens 302 includes eight lenslets 802 and the PIR sensor 120 has two sensor elements, which results in 16 view cones.

In addition, each vertical pair of lenslets 802 (e.g., lenslets 802-1 and 802-5, lenslets 802-2 and 802-6, lenslets 802-3 and 802-7, and lenslets 802-4 and 802-8) provides vertically overlapping view cones, further details of which are shown in FIG. 10. The lenslets 802 in the second row 806 are larger than the lenslets in the first row 804. In particular, the lenslets 802 in the second row have a greater area and/or height than that of the lenslets 802 in the first row 804. The greater area and/or greater height of a lenslet increases the sensitivity for the PIR sensor 120 within the view cone created by that lenslet in comparison to another lenslet with a smaller area or lesser height. In this way, the sensitivity of the PIR sensor 120 is biased (e.g., greater) through the second row 806 of lenslets 802 and is comparatively less sensitive through the first row 804 of lenslets 802. Further, and as described in relation to FIG. 10, the vertical offset of the PIR sensor 120 relative to a vertical center of the second row 806 of lenslets 802 creates view cones that are directed downward from horizontal, which is useful in detecting motion at lesser distances. In addition, the lenslets 802 are shaped, sized, and configured to have substantially uniform sensitivity across the view cones created by the first row 804 of lenslets 802 and substantially uniform sensitivity across the view cones created by the second row 806 of lenslets 802.

Figure 9:
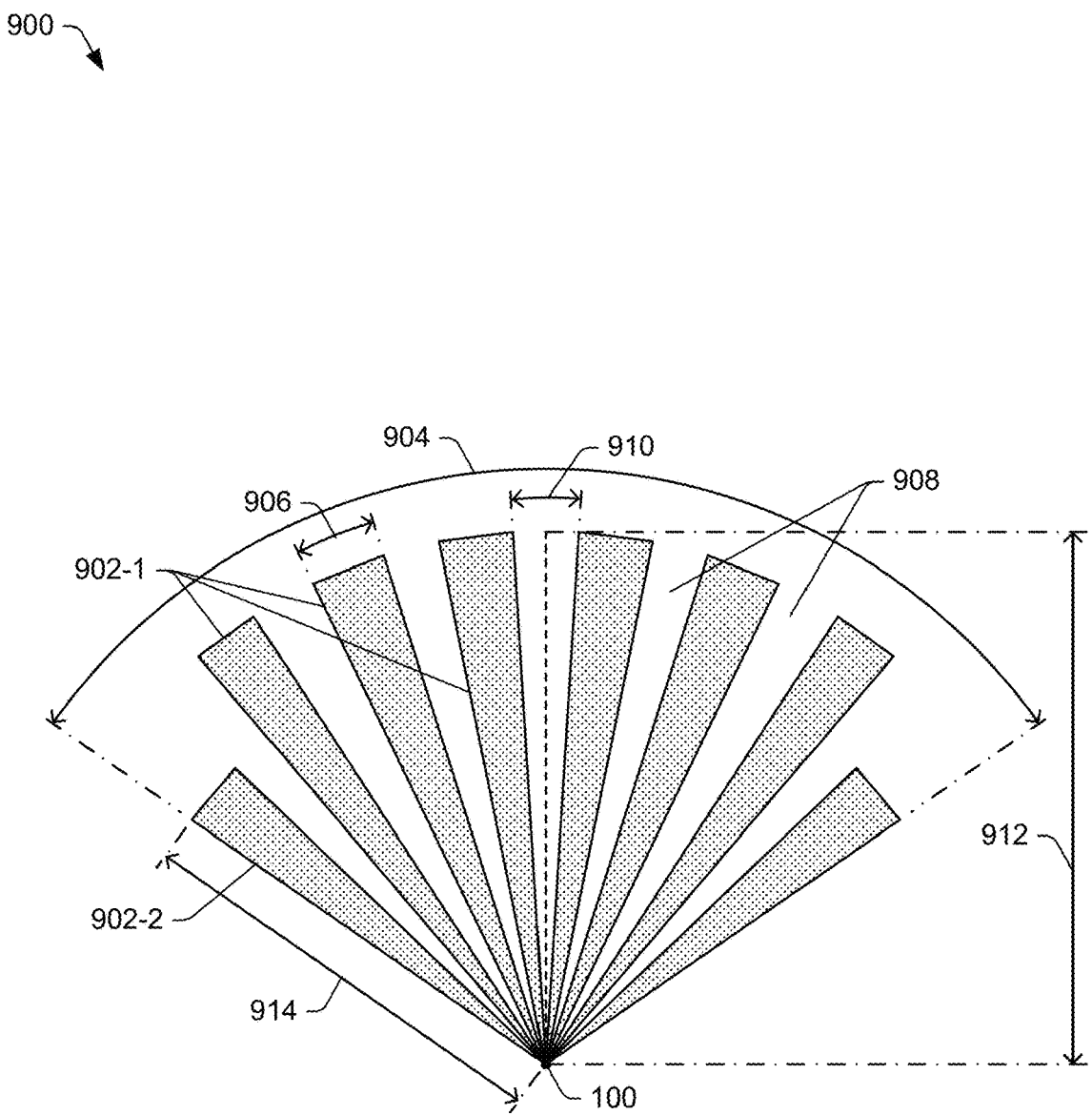
FIG. 9 illustrates a top view of the FOV of the PIR sensor using the PIR lens in FIG. 8.

Continuing, FIG. 9 illustrates a top view 900 of the FOV of the PIR sensor 120 using the PIR lens 302 in FIG. 8. The illustrated example shows eight view cones 902, which correspond to the first row 804 of lenslets in FIG. 8. The PIR sensor 120 may have an overall horizontal FOV (hFOV) 904 of any suitable range and each view cone 902 may have a hFOV 906 of any suitable range that is smaller than the overall hFOV 904. In an example, the overall hFOV 904 of the PIR sensor 120 is substantially within a range of 90° to 180° (e.g., 110°). In a further example, the hFOV 906 of each view cone 902 is substantially within a range of 5° to 12° (e.g., 8°). In some aspects, a gap 908 exists between the view cones 902, and the PIR sensor 120 cannot detect motion in the gap 908. The gap 908 may have a gap size 910 that is substantially within a range of 1° to 10° (e.g., 7°). Including the gap 908 between the view cones 902, resulting in separate and horizontally independent view cones, increases the efficiency of tangential motion detection by the PIR sensor 120. For example, a person crossing over multiple view cones 902 can be easily detected based on the changes in radiation (e.g., heat) caused by the user and detected by the PIR sensor 120.

Generally, PIR sensors are more sensitive toward the middle of the overall hFOV 904 and less sensitive toward the sides of the overall hFOV 904. Using the PIR lens 302, for example, inner view cones 902-1 in the middle may have a radius 912 of approximately 25 feet (ft) (7.62 meters (m)) and outer view cones 902-2 may have a radius 914 of approximately 20 ft. Because users typically mount the electronic device 100 proximate to a standard location of a doorbell (next to the front door of the house), visitors typically approach the house (and the electronic device 100) in the inner view cones and less so in the outer view cones.

Figure 10A:
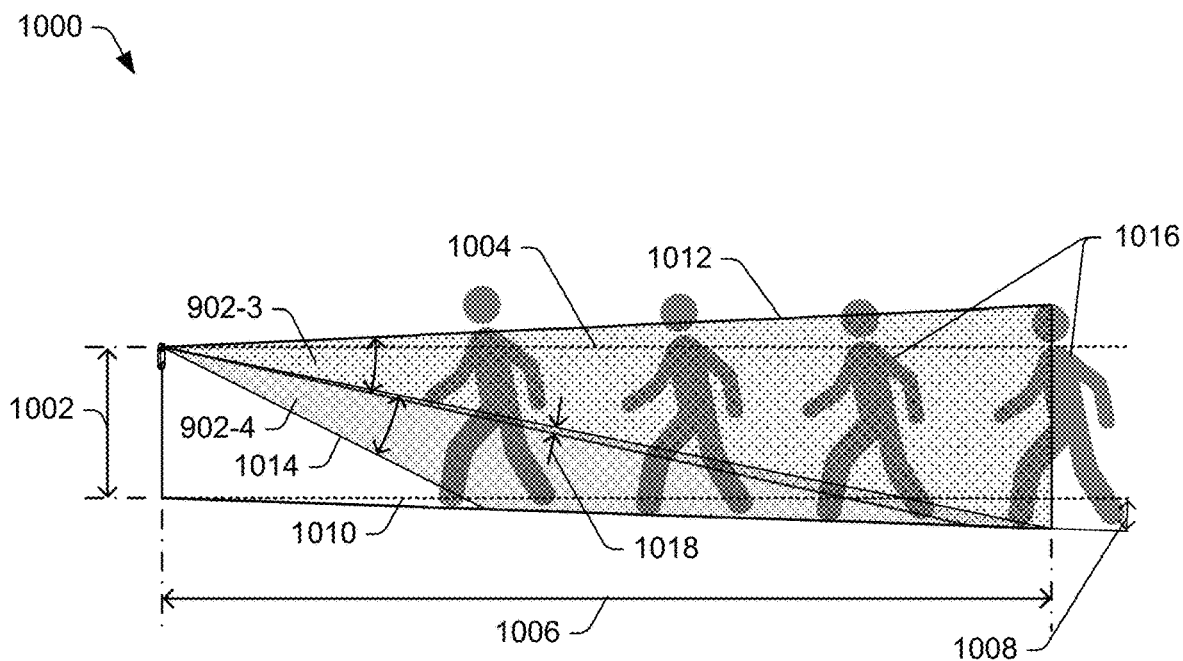
FIGS. 10A and 10B illustrate example side views of the FOV of the PIR sensor using the PIR lens in FIG. 8, in accordance with radial motion of an adult (FIG. 10A) and a child (FIG. 10B)
Figure 10B:
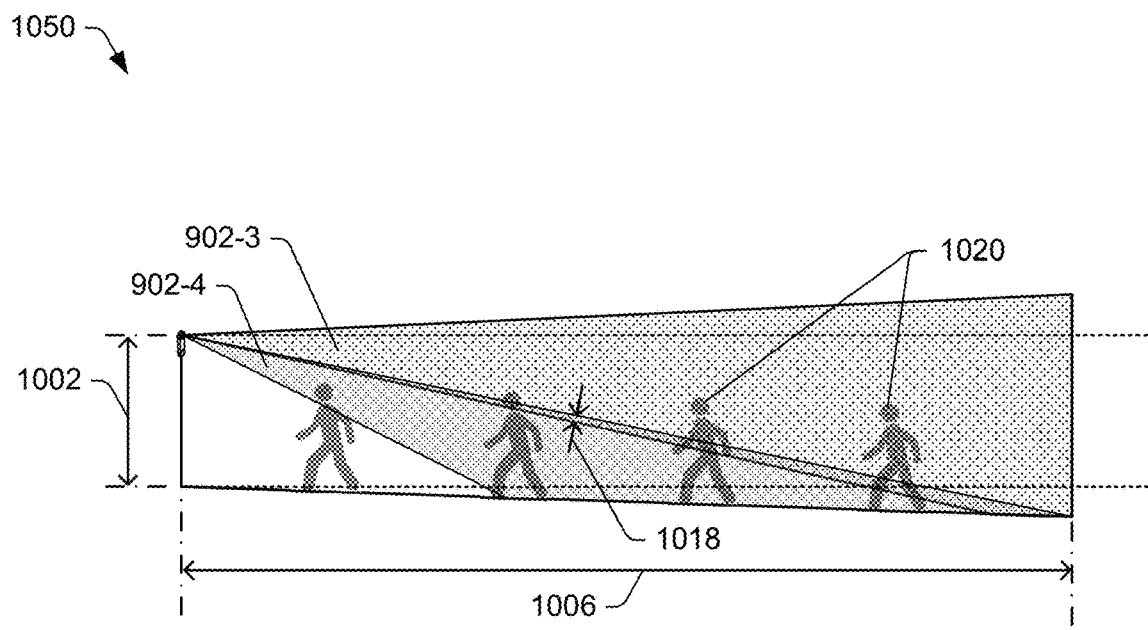

Consider now FIGS. 10A and 10B, which illustrate examples of side views 1000 and 1050 of the FOV of the PIR sensor 120 using the PIR lens 302 in FIG. 8, in accordance with radial motion of an adult (FIG. 10A) and a child (FIG. 10B). In the illustrated examples, a pair of vertically stacked view cones 902 (e.g., top view cone 902-3 and bottom view cone 902-4) are shown relative to the electronic device 100. The top view cone 902-3 corresponds to a view cone 902 in the first row 804 of the lenslets 802 in the PIR lens 302 in FIG. 8, including view cones 902-1, 902-2, 902-3, and 902-4. The bottom view cone 902-4 corresponds to a view cone 902 in the second row 806 of the lenslets 802 in the PIR lens 302 in FIG. 8, including 902-5, 902-6, 902-7, and 902-8. In the illustrated example, the electronic device 100 is mounted to the wall at a height 1002 of approximately 4 ft 2.8 inches (in) (1.29 m), such that an axial center (e.g., axis 1004) of the PIR sensor 120 is approximately five feet (1.524 m) above ground at a distance 1006 of 25 ft and with the ground having a downward slope 1008 of approximately 2° from a horizontal axis 1010 that is normal to the wall on which the electronic device 100 is mounted. However, the electronic device 100 may be mounted to the wall at any suitable height. Generally, a doorbell may be mounted at a height within a range of 3.5 ft (1.067 m) to 4.5 ft (1.372 m).

The top view cone 902 is directed to include a volume above the axis 1004 of the PIR sensor 120. In an example, the upper boundary (e.g., upper boundary 1012) of the top view cone 902 may be substantially within a range of 1° to 10° above the axis 1004, including 3°. In addition, the bottom view cone 902 is directed at a downward angle below the top view cone 902, which may be any suitable angle below the axis 1004. For example, the bottom view cone 902 may be directed at a downward angle that is within a range of 10° to 30° degrees below the axis 1004, including 13°. In an example, the lower boundary (e.g., lower boundary 1014) of the bottom view cone 902 may be substantially within a range of 20° to 45° below the axis 1004, including 27°. The example 1000 also shows a person 1016 (e.g., adult) approaching the electronic device 100 and having a height of approximately 6 ft 2 in (1.88 m).

It is noted that an overlap 1018 exists between the top view cone 902-3 and the bottom view cone 902-4, which enhances detection of radial motion. The upper limit of the bottom view cone 902 may reach the distance 1006 of approximately 25 ft (assuming the downward slope 1008 of the ground). Accordingly, when the person 1016 approaches within the distance 1006, the person 1016 enters the bottom view cone 902-4 and the amount of radiation (e.g., heat) that is detected by the PIR sensor 120 rapidly increases. The detected increase is due to the overlap 1018 and the bottom view cone 902 because the PIR lens 302 is tailored to enable the PIR sensor 120 to have a higher sensitivity in the bottom view cone(s) 902-4 in comparison to the top view cone(s) 902-3. The PIR sensor 120 may output a signal when there is a rapid change in incident radiation. The increase in detected radiation caused by the bottom view cone 902-4 enables the person 1016 to be detected sooner. Further, as the person 1016 radially approaches the PIR sensor 120, more and more of their body enters the bottom view cone 902-4, which causes rapid changes in the incident radiation detectable by the PIR sensor 120.

Similarly, a short person (e.g., child 1020) radially approaching the electronic device 100 may be detected upon entering the bottom view cone 902-4. In a radial approach, the PIR sensor 120 of a conventional camera doorbell that only has a single row of lenslets may have difficulty detecting the child 1020 because much of the child's body is below the corresponding view cones. However, by implementing the second row 806 of lenslets 802 to create the bottom view cone(s) 902-4, the PIR sensor 120 detects rapid changes in incident heat corresponding to the child 1020 when the child 1020 enters one or more of the bottom view cone(s) 902-4 and radially moves closer to the PIR sensor 120, causing more and more of their body to enter the bottom view cone 902-4.

In some instances, there may be stairs leading up to the electronic device 100, which enable a person to be substantially below the top view cone 902. The bottom view cone 902 enables enhanced motion detection of the person 1016 or the child 1020 as they walk up the stairs because they are radially approaching the electronic device 100 from substantially within the bottom view cone 902.

Example Computing System

Figure 11:
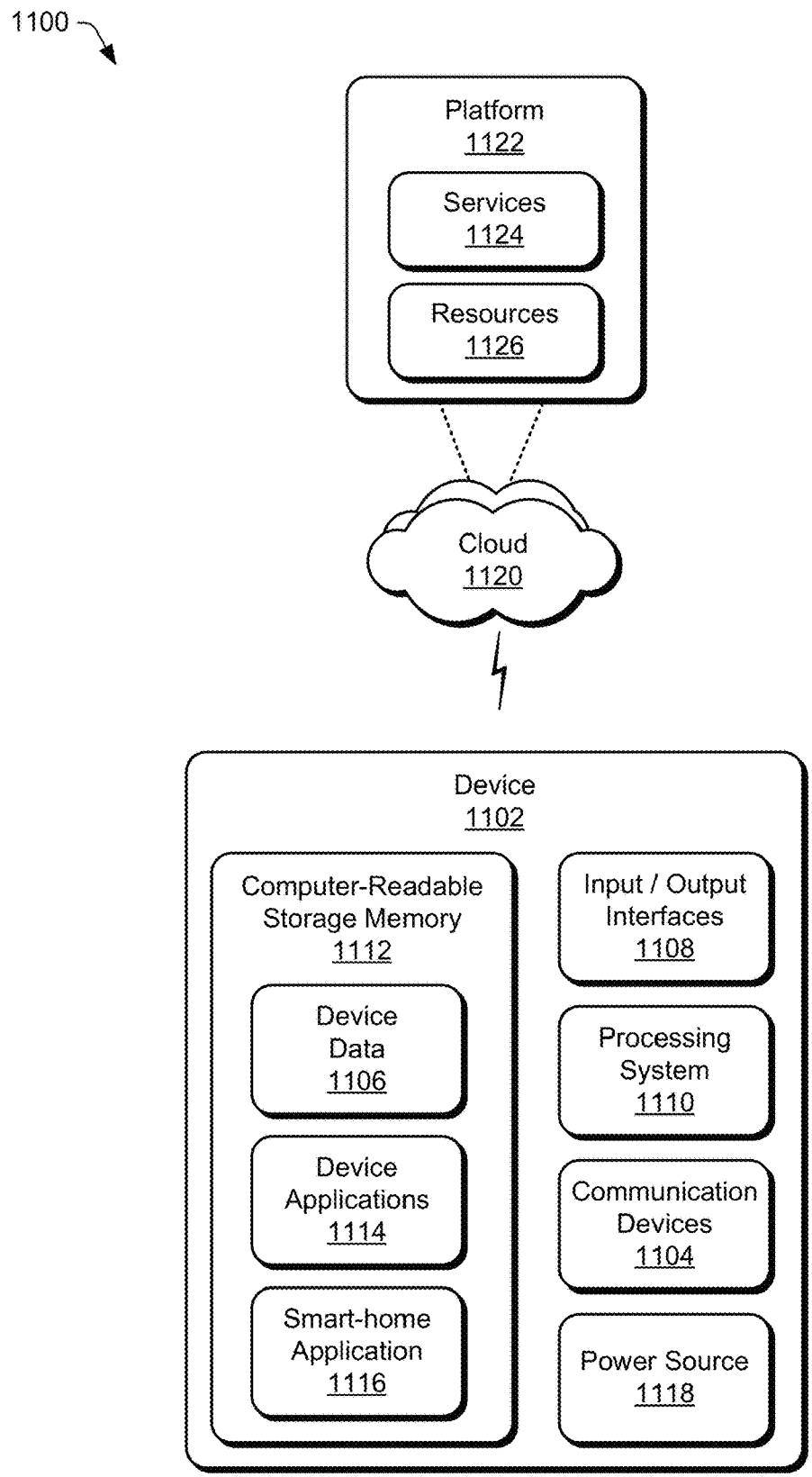
FIG. 11 is a block diagram illustrating an example system that includes an example device, which can be implemented as any electronic device (e.g., the electronic device in FIG. 1) that implements aspects of asymmetric camera sensor positioning as described with reference to FIGS. 1 to 10B.

FIG. 11 is a block diagram illustrating an example system 1100 that includes an example device 1102, which can be implemented as any electronic device (e.g., the electronic device 100 in FIG. 1) that implements aspects of an image-capturing doorbell device as described with reference to FIGS. 1 to 10B. The example device 1102 may be any type of computing device, client device, mobile phone, tablet, communication, entertainment, gaming, media playback, and/or other type of device. Further, the example device 1102 may be implemented as any other type of electronic device that is configured for communication on a network, such as a thermostat, doorbell, hazard detector, camera, light unit, commissioning device, router, border router, joiner router, joining device, end device, leader, access point, a hub, and/or other electronic devices. The example device 1102 can be integrated with electronic circuitry, microprocessors, memory, input output (I/O) logic control, communication interfaces and components, as well as other hardware, firmware, and/or software to communicate via the network. Further, the device 1102 can be implemented with various components, such as with any number and combination of different components as further described below.

The device 1102 includes communication devices 1104 that enable wired and/or wireless communication of device data 1106, such as data that is communicated between the devices in a network, data that is being received, data scheduled for broadcast, data packets of the data, data that is synched between the devices, etc. The device data can include any type of communication data, as well as audio, video, and/or image data that is generated by applications executing on the device. The communication devices 1104 can also include transceivers for cellular phone communication and/or for network data communication. The communication devices 1104 can include wireless radio systems for multiple, different wireless communications systems. The wireless radio systems may include Wi-Fi, Bluetooth™, Mobile Broadband, Bluetooth Low Energy (BLE), and/or point-to-point IEEE 802.15.4. Each of the different radio systems can include a radio device, antenna, and chipset that is implemented for a particular wireless communications technology.

The device 1102 also includes input/output (I/O) interfaces 1108, such as data network interfaces that provide connection and/or communication links between the device, data networks (e.g., an internal network, external network, etc.), and other devices. The I/O interfaces can be used to couple the device to any type of components, peripherals, and/or accessory devices. The I/O interfaces also include data input ports via which any type of data, media content, and/or inputs can be received, such as user inputs to the device, as well as any type of communication data, such as audio, video, and/or image data received from any content and/or data source.

The device 1102 includes a processing system 1110 that may be implemented at least partially in hardware, such as with any type of microprocessors, controllers, or the like that process executable instructions. The processing system can include components of an integrated circuit, programmable logic device, a logic device formed using one or more semiconductors, and other implementations in silicon and/or hardware, such as a processor and memory system implemented as a system-on-chip (SoC). Alternatively or in addition, the device can be implemented with any one or combination of software, hardware, firmware, or fixed logic circuitry that may be implemented with processing and control circuits. The device 1102 may further include any type of a system bus or other data and command transfer system that couples the various components within the device. A system bus can include any one or combination of different bus structures and architectures, as well as control and data lines.

The device 1102 also includes computer-readable storage memory 1112, such as data storage devices that can be accessed by a computing device, and that provide persistent storage of data and executable instructions (e.g., software applications, modules, programs, functions, or the like). The computer-readable storage memory described herein excludes propagating signals. Examples of computer-readable storage memory include volatile memory and non-volatile memory, fixed and removable media devices, and any suitable memory device or electronic data storage that maintains data for computing device access. The computer-readable storage memory can include various implementations of random access memory (RAM), read-only memory (ROM), flash memory, and other types of storage memory in various memory device configurations.

The computer-readable storage memory 1112 provides storage of the device data 1106 and various device applications 1114, such as an operating system that is maintained as a software application with the computer-readable storage memory and executed by the processing system 1110. The device applications may also include a device manager, such as any form of a control application, software application, signal processing and control module, code that is native to a particular device, a hardware abstraction layer for a particular device, and so on. In this example, the device applications also include a smart-home application 1116 that implements aspects of the image-capturing doorbell device, such as when the example device 1102 is implemented as any of the electronic devices described herein. The device 1102 also includes a power source 1118, such as the battery 122. An alternating current (AC) power source may also be used to charge the battery of the device.

In aspects, at least part of the techniques described for the electronic device 100 may be implemented in a distributed system, such as over a "cloud" 1120 in a platform 1122. The cloud 1120 includes and/or is representative of the platform 1122 for services 1124 and/or resources 1126.

The platform 1122 abstracts underlying functionality of hardware, such as server devices (e.g., included in the services 1124) and/or software resources (e.g., included as the resources 1126), and communicatively connects the example device 1102 with other devices, servers, etc. The resources 1126 may also include applications and/or data that can be utilized while computer processing is executed on servers that are remote from the example device 1102. Additionally, the services 1124 and/or the resources 1126 may facilitate subscriber network services, such as over the Internet, a cellular network, or Wi-Fi network. The platform 1122 may also serve to abstract and scale resources to service a demand for the resources 1126 that are implemented via the platform, such as in an interconnected device implementation with functionality distributed throughout the system 1100. For example, the functionality may be implemented in part at the example device 1102 as well as via the platform 1122 that abstracts the functionality of the cloud 1120.

Some examples are provided below:

An image-capturing doorbell device comprising: a housing having an elongated shape with opposing first and second ends, each of the first and second ends having a generally radial curvature and intersecting a longitudinal axis of the housing, the housing including a substantially planar front surface with a substantially obround shape; an IR cover forming an annular shape with a center aperture, the IR cover located on the front surface of the housing and proximate to the first end; a button positioned proximate to the second end of the housing on the front surface, the button having an elliptical shape; a light ring positioned along a perimeter of the button, the light ring configured to diffuse light generated by a light source within the housing; and a camera module positioned proximate to the first end of the housing, the camera module including a camera lens having an axial center that is substantially normal to the front surface of the housing, the camera lens extending through the center aperture of the annular shape of the IR cover and protruding from an outer surface of the IR cover by a predefined distance to mitigate IR flare.

The IR cover may protrude from the front surface of the housing; the IR cover may include a PIR lens and an IR window; and the PIR lens and the IR window may each include an IR translucent material.

The image-capturing doorbell device may further comprise: one or more IR LEDs aligned with the IR window; a PIR sensor aligned with the PIR lens; and an image sensor aligned with the camera lens.

The camera lens may protrude from the outer surface of the IR cover in a direction that is substantially normal to the front surface of the housing.

The PIR lens may be aligned with the PIR sensor; the PIR lens may include an array of lenslets each comprising a set of concentric annular sections usable to create a view cone for the PIR sensor; and the array of lenslets may include a first row of lenslets stacked above a second row of lenslets.

Each lenslet in the first row may be paired with a respective lenslet in the second row to form a pair of vertically stacked lenslets; and each pair of vertically stacked lenslets may provide a pair of overlapping view cones for increased sensitivity.

The lenslets in the second row of lenslets may have a larger size than the lenslets in the first row of lenslets; and the PIR sensor may have increased sensitivity for motion detection through the second row of lenslets in comparison to the first row of lenslets based on the larger size of the lenslets in the second row in comparison to the lenslets in the first row.

The second row of lenslets may provide view cones for the PIR sensor that are focused at a downward angle relative to an axial center of the PIR sensor.

The PIR lens may be shaped as a portion of a ring having a curved outer edge and a curved inner edge; and the array of lenslets may be located between the curved outer edge and the curved inner edge.

The image-capturing doorbell device may further comprise a sensor printed circuit board, PCB, wherein the PIR sensor and the image sensor are mounted to a same surface of the sensor PCB.

The sensor PCB may include separate ground planes for each of the PIR sensor and the image sensor; and the sensor PCB may define a slot that separates the ground planes.

The light ring may be concentric with the button and flush with an exterior surface of the button; and the light ring may include a diffusive material to enable light, generated by one or more light sources within the housing, to pass through the light ring.

The light ring may include a diffusive material to enable light, generated by one or more light sources within the housing, to pass through the light ring.

The image-capturing doorbell device may further comprise: one or more LEDs mounted to the main logic board and oriented to fire toward a backside of the button; and a light guide positioned between the one or more LEDs and the button, the light guide configured to guide the light from the one or more LEDs toward the light ring.

The image-capturing doorbell device may further comprise a plurality of diffusive flanges that: structurally support the button; are distributed around a perimeter of the light guide; and enable light exiting the light guide to travel through the plurality of diffusive flanges toward the light ring.

CONCLUSION

Although aspects of the image-capturing doorbell device have been described in language specific to features and/or methods, the subject of the appended claims is not necessarily limited to the specific features or methods described. Rather, the specific features and methods are disclosed as example implementations of the claimed image-capturing doorbell device, and other equivalent features and methods are intended to be within the scope of the appended claims. Further, various different aspects are described, and it is to be appreciated that each described aspect can be implemented independently or in connection with one or more other described aspects.

What is claimed is:

1. An image-capturing doorbell device comprising:
    a housing having opposing first and second ends intersecting a longitudinal axis of the housing;
    an infrared-(IR) cover located on a front surface of the housing and proximate to the first end;
    a passive infrared (PIR) lens disposed within the IR cover and having an array of lenslets, each lenslet in the array of lenslets including a set of concentric annular sections usable to create a view cone for a PIR sensor having a first axial center, the array of lenslets configured to provide a plurality of view cones for the PIR sensor, the plurality of view cones including:
        a first subset of view cones arranged in a first row with adjacent view cones in the first row being separated by a gap, each view cone in the first subset of view cones including a volume above the first axial center of the PIR sensor; and
        a second subset of view cones arranged in a second row and stacked with the first row, the second subset of view cones overlapping with the first subset of view cones in a direction of the longitudinal axis of the housing;
    one or more PIR sensors configured to detect motion of a person moving in a direction substantially parallel to one of the plurality of view cones by detecting an amount of radiation that rapidly increases due to at least the overlap between a pair of view cones that overlap one another in the direction of the longitudinal axis of the housing; and
    a camera module positioned proximate to the first end of the housing, the camera module including a camera lens having a second axial center that is substantially normal to the front surface of the housing.

2. The image-capturing doorbell device of claim 1, wherein the volume above the first axial center is substantially within a range of one degree to ten degrees above the first axial center of the PIR sensor.

3. The image-capturing doorbell device of claim 1, wherein the second subset of view cones are each directed at a downward angle that is within a range of 10 to 30 degrees below the first axial center of the PIR sensor.

4. The image-capturing doorbell device of claim 1, wherein:
    the array of lenslets includes a first row of lenslets corresponding to the first subset of view cones and a second row of lenslets corresponding to the second subset of view cones;
    the first row of lenslets is stacked above the second row of lenslets to form multiple columns of stacked lenslets including two outer columns separated by at least one middle column; and
    the at least one middle column is centered on the PIR lens.

5. The image-capturing doorbell device of claim 4, further comprising multiple PIR sensors aligned with the PIR lens at a location that is offset from a first dividing line between the lenslets in the at least one middle column.

6. The image-capturing doorbell device of claim 5, wherein the first dividing line is offset from a second dividing line that is between lenslets of at least one of the two outer columns.

7. The image-capturing doorbell device of claim 4, wherein, in a longitudinal direction of the first and second rows, a first width of each lenslet in the two outer columns is greater than a second width of each lenslet in the at least one middle column.

8. The image-capturing doorbell device of claim 4, wherein:
    at least one column of the multiple columns of stacked lenslets includes a first lenslet stacked above a second lenslet;

the first lenslet includes an edge adjacent to the second lenslet;

the first lenslet includes a focus center positioned proximate to the edge that is adjacent to the second lenslet.

9. The image-capturing doorbell device of claim 8, wherein the focus center is positioned beyond the edge of the first lenslet and overlaps the second lenslet.

10. The image-capturing doorbell device of claim 8, wherein the focus center is positioned substantially at the edge of the first lenslet.

11. The image-capturing doorbell device of claim 4, wherein:

the at least one middle column includes first and second columns of lenslets;

the first column of lenslets is adjacent to the second column of lenslets;

the first column of lenslets includes first and second opposing edges;

the second column of lenslets includes third and fourth opposing edges; and the second edge of the first column of lenslets is adjacent to the third edge of the second column of lenslets.

12. The image-capturing doorbell device of claim 11, wherein:

the first column of lenslets includes a first lenslet, which is in the first row of lenslets and has a first focus center that is offset from a first center of the first lenslet toward the first edge; and the second column of lenslets includes a second lenslet, which is in the first row of lenslets and has a second focus center that is offset from a second center of the second lenslet toward the fourth edge.

13. The image-capturing doorbell device of claim 11, wherein:

each lenslet in the first column of lenslets has a first corresponding focus center that is closer to the first edge than the second edge; and each lenslet in the second column of lenslets has a second corresponding focus center that is closer to the fourth edge than the third edge.

14. The image-capturing doorbell device of claim 11, wherein the PIR sensor is aligned with the second and third edges of the first and second columns of lenslets, respectively.

15. The image-capturing doorbell device of claim 4, wherein:

the lenslets in the second row of lenslets have a larger size than the lenslets in the first row of lenslets; and the PIR sensor has higher sensitivity for motion detection through the second subset of view cones in comparison to the first subset of view cones based on the lenslets in the second row of lenslets having a larger size in comparison to the lenslets in the first row of lenslets.

16. The image-capturing doorbell device of claim 1, wherein:

the PIR lens is shaped as a portion of a ring having a curved outer edge and a curved inner edge; and the array of lenslets is located between the curved outer edge and the curved inner edge.

17. The image-capturing doorbell device of claim 1, further comprising a button positioned proximate to the second end of the housing on the front surface, wherein:

the button has an elliptical shape;

the image-capturing doorbell device further comprises a light ring positioned along a perimeter of the button; and the light ring is configured to diffuse light generated by one or more light sources within the housing.

18. The image-capturing doorbell device of claim 17, wherein:

the light ring is concentric with the button and flush with an exterior surface of the button;

the light ring includes a diffusive material to enable light, generated by the one or more light sources within the housing, to pass through the light ring; and the light ring is bonded to the button via a two-shot molding technique.

19. The image-capturing doorbell device of claim 18, further comprising:

one or more light-emitting diodes (LEDs) mounted to a main logic board and oriented to fire toward a backside of the button; and a light guide positioned on the backside of the button, the light guide configured to guide the light from the one or more LEDs toward the light ring.

20. The image-capturing doorbell device of claim 19, further comprising:

a flexible button component disposed within the housing and configured to apply a biasing force against a center area of the light guide in a direction toward the backside of the button; and a plurality of diffusive flanges disposed within the housing, wherein the plurality of diffusive flanges:

are distributed around a perimeter of the light guide;

structurally support the button by providing a resistive force against the light guide in a direction away from the button; and enable light exiting the light guide to travel through the plurality of diffusive flanges toward the light ring.

* * * * *